United States Patent Office 3,035,990

Patented May 22, 1962

3,035,990
CHEMICAL BLANKING OF ALUMINUM SHEET METAL

Gareth J. Davis and Peter C. Peropoulos, Cedar Rapids, Iowa, assignors to Collins Radio Company, Cedar Rapids, Iowa, a corporation of Iowa No Drawing. Filed Nov. 5, 1958, Ser. No. 771,965
3 Claims. (Cl. 204—15)

This invention relates to a novel etching method of the type commonly known in the art as selective etching and more particularly is concerned with an efficient means of etching aluminum plate.

The application of chemical etchants to metal working is a well-known expedient in the art and various methods of selectively etching metallic plates have been devised whereby the surface is first coated with a resist coating and areas to be etched are left exposed. A chemical etchant is then applied to the resulting surface to selectively attack the exposed metallic areas to various degrees depending upon the ultimate purpose of the etching process. This process finds wide usage in the photo engraving art, for example, whereby an image may be raised in relief on a metallic plate for the purpose of reproduction by offset printing methods.

A process commonly used employs bimetallic sheets of different chemical compositions to which etching solutions are successively applied to attack one metal while not substantially affecting the other.

The present invention is generally related to the selective etching of bimetallic plates and is particularly concerned with a successful method for etching aluminum. The etching of aluminum involves high exothermic reactions and the extremely high temperatures produced in the etching processes commonly employed, such as applications of hydroxide, introduce serious control problems. When the etching process is carried to an extreme wherein the etched area is to be completely removed or blanked from the sheet, the reactions become still more exothermic and successful chemical blanking of aluminum by methods known in the art necessarily involves slowing the etching reaction to control the heat such that the resist employed will not be exposed to damaging temperatures. In certain applications wherein, for example, substantial areas of the plate are to be removed, the high temperatures involved may destroy the remaining aluminum plate area and thus render the process unsuccessful. If slowed down sufficiently to reduce the reaction heat, the process becomes commercially impractical.

Because of the extreme heat generated in processes for chemically etching aluminum, to carry the etching of aluminum to the complete blanking of surface areas by merely coating the aluminum with a resist and then directly applying an etchant to selectively attack the aluminum becomes difficult and ofttimes impossible. While known resists may be used in a limited manner for blanking aluminum, the extreme temperatures produced destroy the resist and thus render such a direct process impractical. Should the reaction be controlled to hold the heat at a point where the resist will not decompose, the resulting etching process is slowed to a point to render the process inefficient. It should be further noted that in all instances wherein chemical etching is employed to form metallic plates, the undercutting of the metallic area beneath the resist along the edges of the exposed areas is a serious problem and thus, generally, any etching process which must be carried on for a considerable length of time will increase the difficulty of controlling undercut.

The above discussed problems of resist failures due to heat have brought about the use of bimetallic etching processes wherein the plate to be etched may be coated with one or more metallic layers having different chemical composition. The process is then carried on by using different etchants which will selectively remove one metal to the exclusion of another to ultimately selectively attack the base metal. The metals and etchants employed are chosen such that the reaction heat generated is tolerable. Thus, in the preparation of printing plates, for example, such a process is widely used employing the plating of a zinc sheet with copper over which a resist is selectively applied. The copper is first removed by a selective etchant followed by a selective etching of the resulting exposed zinc areas. These bimetallic selective etching processes, however, are generally overly complicated when the base metal to be ultimately etched or formed is aluminum. Aluminum is extremely difficult to plate, and, generally, the employment of bimetallic selective etching processes to aluminum involves successively applying a prohibitive number of layers of metallic plates in order to arrive at a resulting composite surface to which selective etchants may be sequentially applied. Each step in a selective etching process introduces further undercut and thus the use of multilayers of different metallic composition multiplies the undercut problem.

An object of the present invention, therefore, is the provision of a straightforward method of etching aluminum sheet metal wherein the steps are reduced to a minimum and wherein the extremely high reaction temperatures inherent to aluminum etching are not a limiting factor. The invention is featured in the provision of a process for etching aluminum in which a heavy oxide coating thereon is used to advantage as a resist.

These and other objects and advantages of the present invention are realized by the process to be described wherein basically sheet aluminum is anodized prior to coating with a resist and the exposed anodized surfaces selectively etched by a hydroxide etchant to which the resist is substantially chemically inert and the resulting surface configuration then exposed to a further etchant which selectively attacks the exposed aluminum base metal and to which the anodized surface areas are substantially chemically inert.

In processes known in the art wherein aluminum is to be etched, the first step generally is to remove the inherent formation of aluminum oxide on the surface. Prior art patents deal specifically with methods by which this oxide may be removed. The present invention uses this oxide coating to a novel advantage and obviates the necessity for complicated multistep selective etching processes now used to successfully etch aluminum.

By the process of this invention, the aluminum sheet to be etched or blanked is first anodized and thus the heretofore troublesome surface coating of aluminum oxide is in fact increased to a substantial thickness to ultimately serve as a resist. The anodized aluminum sheet is then coated with a preselected resist pattern. This resist pattern may be one of a number of well-known resist coatings known in the art, generally organic, which may be applied through a stencil, silk screen, or applied by well-known photographic methods to the anodized surface such that the areas of the aluminum sheet to be ultimately etched lie beneath exposed anodized areas. A hydroxide is then applied to the resulting surface configuration to etch away the anodized film in exposed areas. The resist need only be sufficient to withstand the hydroxide application for a period of time long enough to allow the hydroxide to attack and remove the anodized film in these exposed areas. The anodized film is rapidly removed by the hydroxide and very little heat is generated by this step. The resulting surface configuration is thus a selectively anodized aluminum sheet with areas of exposed aluminum thereon corresponding to the original areas of exposed anodized film. The process is then completed by applying to the resulting surface configuration an etchant which will selectively attack the exposed aluminum to the exclusion of the anodized surface areas. The process has been successfully operated using sodium hydroxide to first attack the exposed anodized areas and ferric chloride to subsequently attack the exposed aluminum areas. Ferric chloride, for example, readily attacks aluminum, while the anodized film is an excellent resist to ferric chloride. The anodized film is capable of withstanding extreme temperatures.

Since any process for etching aluminum generates considerable heat and heat serves as a catalyst to the reaction, localized areas may go out of control as a result of their inability to rid themselves of the heat generated. In a preferred application of the process of this invention, the exposed aluminum area is etched by siphoning ferric chloride into a compressed air stream for application to the exposed aluminum areas. This process creates considerable turbulence in the environment of the etching reaction, thus carrying away much of the heat generated. This preferred method of application additionally minimizes the undercut due to the turbulent application of the etchant normal to the surface area to be etched.

By this invention a process is thus provided whereby aluminum plates may be etched or blanked with a minimum of steps and whereby the use of successive metallic plate applications over the aluminum is unnecessary. Aluminum sheet metal is readily available in anodized form and thus stock material of anodized aluminum may be directly operated upon by the present process without the necessity of first taking elaborate steps to condition the surface thereof. The original pattern-defining resist coating may be any of the well-known resists, light sensitive or otherwise. The employment of the anodized surface enables the chemical blanking of aluminum sheet metal to extents heretofore not possible and provides a method for etching aluminum by which the process may be speeded up to increase the efficiency without the correspondingly high reaction temperatures becoming a serious limiting factor. By the present process, aluminum sheet metal may be blanked rapidly and efficiently to an extent whereby it might replace die stamping on a production basis. Especially in small production runs of many different types, the present process can result in a substantial saving in machine die tooling and, in fact, may be applied to chemical blanking of aluminum sheet metal for producing aluminum parts having configurations for which the preparation of a steel die might be highly impractical, or in many cases impossible.

Throughout the above description, the etchants are described as selectively atacking certain surfaces, while remaining surfaces are substantially chemically inert to the etchant. The process is not to be limited to absolute chemical inertness. The etchants need only selectively attack and remove certain layers prior to the decomposition of resistive overlay.

Although this invention has been described with respect to a particular embodiment thereof, it is not to be so limited as changes and modifications may be made therein which are within the full intended scope of the invention as defined by the appended claims.

We claim:

1. A method of etching aluminum plate comprising anodizing the surface thereof, coating said anodized surface with a predetermined pattern of resist of the type substantially chemically inert to a hydroxide etchant, exposing said resulting surface to said hydroxide etchant to selectively attack and remove the exposed areas of anodized plate surface and further exposing the resulting surface to a ferric chloride solution by which said aluminum is actively attacked and to which said remaining anodized areas of said plate are substantially chemically inert.

2. A method of etching aluminum plate comprising anodizing the surface thereof, coating the anodized surface with a resist selectively applied to leave predetermined areas of exposed anodize, selectively etching the resultant surface with sodium hydroxide to remove the anodized film from said exposed areas, and further selectively etching the resulting exposed areas of aluminum by application of ferric chloride by which the exposed aluminum is readily attacked and to which the remaining anodized surface area is substantially chemically inert and temperature resistant at extreme reaction temperatures.

3. A method of etching aluminum plate by selective etching comprising anodizing the surface thereof, applying a predetermined pattern of organic resist coat over the anodized film leaving preselected exposed areas of said anodized film, selectively attacking said exposed anodized surface areas with a hydroxide etchant to remove said exposed anodized film and expose the aluminum base metal thereunder, and selectively etching said exposed aluminum areas by application of an air blast into which ferric chloride is siphoned.

References Cited in the file of this patent

UNITED STATES PATENTS

| | | |
|---|---|---|
| 590,966 | Cornwall | Oct. 5, 1897 |
| 1,783,663 | McFarland | Dec. 2, 1930 |
| 2,285,468 | Slunder | June 9, 1942 |
| 2,311,623 | Blackmun | Feb. 23, 1943 |
| 2,472,304 | Mason | June 7, 1949 |
| 2,506,164 | Morse | May 2, 1950 |
| 2,886,420 | Jones et al. | May 12, 1959 |

FOREIGN PATENTS

| | | |
|---|---|---|
| 520,108 | Great Britain | Apr. 15, 1940 |

OTHER REFERENCES

The Metal Industry, June 18, 1943, pages 386–388, "Production of Multi-Colored Effects on Anodized Aluminum," by V. F. Henley.